United States Patent
Jeon

(10) Patent No.: US 10,948,835 B2
(45) Date of Patent: Mar. 16, 2021

(54) METHOD OF LEVELING WAFER IN EXPOSURE PROCESS AND EXPOSURE SYSTEM THEREOF

(71) Applicant: XIA TAI XIN SEMICONDUCTOR (QING DAO) LTD., Qingdao (CN)

(72) Inventor: Bum-Hwan Jeon, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/668,350

(22) Filed: Oct. 30, 2019

(65) Prior Publication Data
US 2020/0201198 A1    Jun. 25, 2020

Related U.S. Application Data

(60) Provisional application No. 62/779,482, filed on Dec. 14, 2018.

(51) Int. Cl.
*G01B 11/25* (2006.01)
*G03F 9/00* (2006.01)

(52) U.S. Cl.
CPC ........ *G03F 9/7034* (2013.01); *G01B 11/2518* (2013.01); *G03F 9/7069* (2013.01)

(58) Field of Classification Search
CPC .... G03F 9/7034; G03F 9/7069; G03F 9/7011; G03F 9/7003; G03F 9/7088; G03F 7/70258; G03F 7/70633; G01B 11/2518; G01N 21/9501

USPC ....... 356/399–401, 237.1–237.5; 355/52, 53, 355/55, 77, 39; 430/22; 250/548, 559.29
See application file for complete search history.

(56) References Cited

U.S. PATENT DOCUMENTS

| | | | | |
|---|---|---|---|---|
| 6,081,614 | A * | 6/2000 | Yamada | G03F 7/70358 382/151 |
| 6,118,515 | A * | 9/2000 | Wakamoto | G03F 7/70358 355/53 |
| 6,882,405 | B2 * | 4/2005 | Jasper | G03F 9/7026 355/55 |
| 2003/0160195 | A1 * | 8/2003 | Kosugi | H01L 21/681 250/559.29 |
| 2006/0160037 | A1 * | 7/2006 | Brodsky | G03F 7/70466 430/396 |
| 2007/0085991 | A1 * | 4/2007 | Liegl | G03F 9/7026 355/55 |
| 2019/0079421 | A1 * | 3/2019 | Mizutani | H01L 21/0274 |
| 2020/0133144 | A1 * | 4/2020 | Schmitt-Weaver | G03F 9/7092 |

* cited by examiner

*Primary Examiner* — Hoa Q Pham
(74) *Attorney, Agent, or Firm* — ScienBiziP, P.C.

(57) ABSTRACT

The present disclosure provides a method of leveling a wafer in an exposure process. The wafer includes a plurality of regions. The wafer is loaded to an exposure system. The exposure system includes a control unit and a leveling module. The control unit of the exposure system obtains layout information of the reticle. The control unit of the exposure system assigns critical regions and non-critical regions to the regions on the wafer according to the layout information of the reticle.

8 Claims, 13 Drawing Sheets

METHOD OF LEVELING WAFER IN EXPOSURE PROCESS AND EXPOSURE SYSTEM THEREOF

CROSS-REFERENCE TO RELATED APPLICATION

This application claims the benefit of and priority to U.S. Provisional Patent Application No. 62/779,482, filed on Dec. 14, 2018, the contents of which are incorporated by reference herein.

FIELD

The present disclosure generally relates to a method of leveling wafer in an exposure process and an exposure system thereof. More specifically, the present disclosure relates to a wafer leveling method that removes topography data of non-critical regions on the wafer.

BACKGROUND

Integrated circuits are generally made by photolithographic processes that use reticles (or photomasks) and an associated light source to project a circuit image on the surface of a semiconductor wafer. The photolithographic process entails coating the wafer with a layer of photoresist, exposing the layer of photoresist and then developing the exposed photoresist. During the process of exposing the layer of photoresist (i.e., exposure process), the wafer coated with a layer of photoresist is loaded to an exposure apparatus and exposed with a pattern of a reticle. The exposure apparatus includes an alignment module that precisely aligns the wafer with respect to the projected image of the reticle, thereby allowing the reticle to be exposed over a selected region on the wafer. Two types of exposure apparatus are typically used in manufacturing. One type is step-and-repeat apparatuses (also referred to as steppers) and the other is step-and-scan apparatuses (also referred to as scanners). When a stepper is used, each exposure region on the wafer is exposed with a single static exposure. When a scanner is used, the wafer is exposed by synchronously scanning the wafer and the reticle across the lens image field.

FIG. 1A is a schematic diagram showing an exposure process. A reticle R100 having a pattern is exposed to a light source for transferring the pattern onto a wafer W100. Usually, the pattern on the reticle R100 is zoomed out on the wafer W100. The pattern on the wafer W100 may be formed by a metal layer (such as copper). Multiple metal layers may be formed on the wafer W100 to form circuits by exposing different reticles using multiple exposure processes. Referring to FIG. 1B, the reticle R100 is made of a transparent layer, and has a die region R120 and an opaque region R110 surrounding the die region R120. The transparent layer is often made of glass, quartz, or the like; and the opaque region typically includes a layer of chromium. The die region R120 generally has a square or rectangular shape and is positioned in the center of the reticle R100. The die region R120 includes transparent portions and opaque portions; the transparent portions and the opaque portions together define a device pattern R122. For the sake of simplicity, the device pattern R122 is not illustrated in detail in the figure. The transparent portions in the die region R120 allow light from a light source to penetrate therethrough and reach the wafer W100. On the other hand, the opaque portions of the die region R120 block the light from reaching the wafer W100. There is a scribe line R121 at the periphery of the die region R120 between the die region R120 and opaque region R110. The scribe line R121 typically contains information regarding the exposure process of the wafer and usually includes test structures to facilitate verification of the performance of the exposure process. For example, the scribe line R121 may include alignment marks to allow verification of the accuracy of the reticle alignment and registration marks to allow measurement of the resolution of the device pattern R122 during the exposure process.

Before the exposure process, the wafer W100 must be pre-scanned by a scanning device having a plurality of leveling sensors to obtain topography data (i.e., height or surface elevation) of the wafer W100. Referring to FIGS. 2A and 2B, a top view and a side view of a portion of the wafer W100 is illustrated. The portion of the wafer W100 has a scribe line W110, and a die region W120. The die region W120 includes portions W121 and W122. As shown in FIG. 2B, the wafer W100 has varying heights across its surface. The portion W121 of the die region W120 has one height, the portion W122 of the die region W120 another height, and the scribe line W110 has the lowest height. The exposure process can tolerate a small range of topography variation through "depth of focus" inherent in the process capability. However, unanticipated topography variation on the W100 has been a challenge for the exposure process and can result in a faulty imaging process and a rejection of the imaged wafer.

Accordingly, there remains a need to improve wafer leveling in an exposure process of the wafer.

SUMMARY

In view of above, the present disclosure is directed to a method of leveling a wafer and an exposure system that improves wafer leveling for an exposure process of the wafer.

An implementation of the present disclosure is directed to a method S400 of leveling a wafer in an exposure process. The method S400 includes actions S401 to S407. In action S401, the wafer is loaded to an exposure system. The exposure system includes a control unit and a leveling module. In action S402, the control unit of the exposure system obtains layout information of a reticle. In action S403, the control unit of the exposure system assigns critical regions and non-critical regions to a plurality of regions on the wafer according to the layout information of the reticle. In action S404, one region of the plurality of regions on the wafer is positioned by the leveling module. In action S405, the control unit of the exposure system determines whether the region is one of the non-critical regions. Then, in action S406 or S407, the leveling module pre-scans the region according to a result of the determination in action S405. In action S406, if the determination in action S405 is true (i.e., the region is determined to be one of the non-critical regions), the action of pre-scanning the region is performed without recording topography data of the region. In action S407, if the determination in action S405 is false (i.e., the region is determined to be one of the critical regions), topography data of the region is recorded when the action of pre-scanning the region is performed.

Another implementation of present disclosure is directed to a method S500 of leveling a wafer in an exposure process. The method S500 includes actions S501 to S505. In action S501, the wafer is loaded to an exposure system. The exposure system includes a leveling module and a control unit. In action S502, the leveling module of the exposure system pre-scans the wafer to obtain topography data regions on the wafer. In action S503, the control unit of the exposure system obtains layout information of a reticle. In action S504, the control unit of the exposure system assigns critical regions and non-critical regions to a plurality of regions on the wafer according to the layout information of the reticle. In action S505, the control unit of the exposure system modifies the topography data of the wafer according to the critical regions and the non-critical regions on the wafer. The topography data of the wafer is modified by removing a portion of the topography data corresponding to the non-critical regions on the wafer.

Still another implementation of the present disclosure is directed to a method S700 of pattern transferring in an exposure process. The method S700 includes actions S701 to S708. In action S701, the wafer is loaded to an exposure system. The exposure system includes a control unit, a leveling module, and a projection module. In action S702, the control unit of the exposure system obtains layout information of a reticle. In action S703, the control unit of the exposure system assigns critical regions and non-critical regions to a plurality of regions on the wafer according to the layout information of the reticle. In action S704, one region of the plurality on the wafer is positioned by the leveling module of the exposure system. In action S705, the control unit of the exposure system determines whether the region is one of the non-critical regions. In action S706, if the region is determined to be one of the non-critical regions in action S705, the leveling module pre-scans the region without recording topography data of the region. In action S707, if the region is not determined to be one of the non-critical regions (i.e., the region is one of the critical regions), the leveling module pre-scans the region and records the topography data of the region. In action S708, the reticle is exposed onto the wafer by the projection module of the exposure system according to the recorded topography data of the wafer.

Yet another implementation of the present disclosure is directed to an exposure system for an exposure process. The exposure system includes a light source, an illumination module, a reticle stage, a projection module, a wafer stage, a leveling module, and a control unit. The light source is configured to generate light. The illumination module is configured to illuminate a reticle with the light from the light source. The reticle stage is configured to hold the wafer. The projection module is configured to project the reticle onto the wafer. The wafer stage is configured to position the wafer. The leveling module has a plurality of leveling sensors and is configured to pre-scan the wafer to obtain topography data of the wafer before the exposure process is performed. The control unit is configured to control the exposure process. The control unit assigns critical regions and non-critical regions to a plurality of regions on the wafer according to layout information of the reticle. The control unit modifies the topography data of the wafer by removing a portion of the topography data corresponding to the non-critical regions. The control unit controls the exposure process according to the modified topography data of the wafer.

Yet another implementation of the present disclosure is directed to a method S800 of pattern transferring in an exposure process. The method S800 includes actions S801 to S806. In action S801, the wafer is loaded to an exposure system. The exposure system includes a leveling module, a control unit, and a projection unit. In action S802, the leveling module of the exposure system pre-scans the wafer to obtain topography data regions on the wafer. In action S803, the control unit of the exposure system obtains layout information of the reticle. In action S804, the control unit of the exposure system assigns critical regions and non-critical regions to a plurality of regions on the wafer according to the layout information of the reticle. In action S805, the control unit of the exposure system modifies the topography data of the wafer according to the critical regions and the non-critical regions on the wafer. The topography data of the wafer is modified by removing a portion of the topography data corresponding to the non-critical regions on the wafer. In action S806, the reticle is exposed onto the wafer by the projection module of the exposure system according to the modified topography data of the wafer.

Yet another implementation of the present disclosure is directed to an exposure system for an exposure process. The exposure system includes a light source, an illumination module, a reticle stage, a projection module, a wafer stage, a leveling module, and a control unit. The light source is configured to generate light. The illumination module is configured to illuminate the reticle with the light from the light source. The reticle stage is configured to hold the wafer. The projection module is configured to project the reticle onto the wafer. The wafer stage is configured to position the wafer. The leveling module has a plurality of leveling sensors and is configured to pre-scan the wafer before the exposure process is performed. The control unit is configured to control the exposure process. The control unit assigns critical regions and non-critical regions to a plurality of regions on the wafer according to layout information of the reticle. When pre-scanning the wafer, the leveling module pre-scans the non-critical regions on the wafer without recording topography data of the non-critical regions, and pre-scans the critical regions on the wafer to record topography data of the critical regions. The control unit controls the exposure process according to the recorded topography data of the wafer.

As described above, the method of leveling a wafer and the exposure system of the implementations of the present disclosure assign non-critical regions and critical regions to the wafer according to layout information of the reticle. By removing the topography data of the non-critical regions on the wafer, the loading of the exposure system during the exposure process can be reduced. Therefore, the method of leveling a wafer and the exposure system of the implementations of the present disclosure can improve performance of wafer leveling in exposure processes of the wafer.

BRIEF DESCRIPTION OF THE DRAWINGS

Implementations of the present technology will now be described, by way of example only, with reference to the attached figures.

DETAILED DESCRIPTION

Figure 1A:
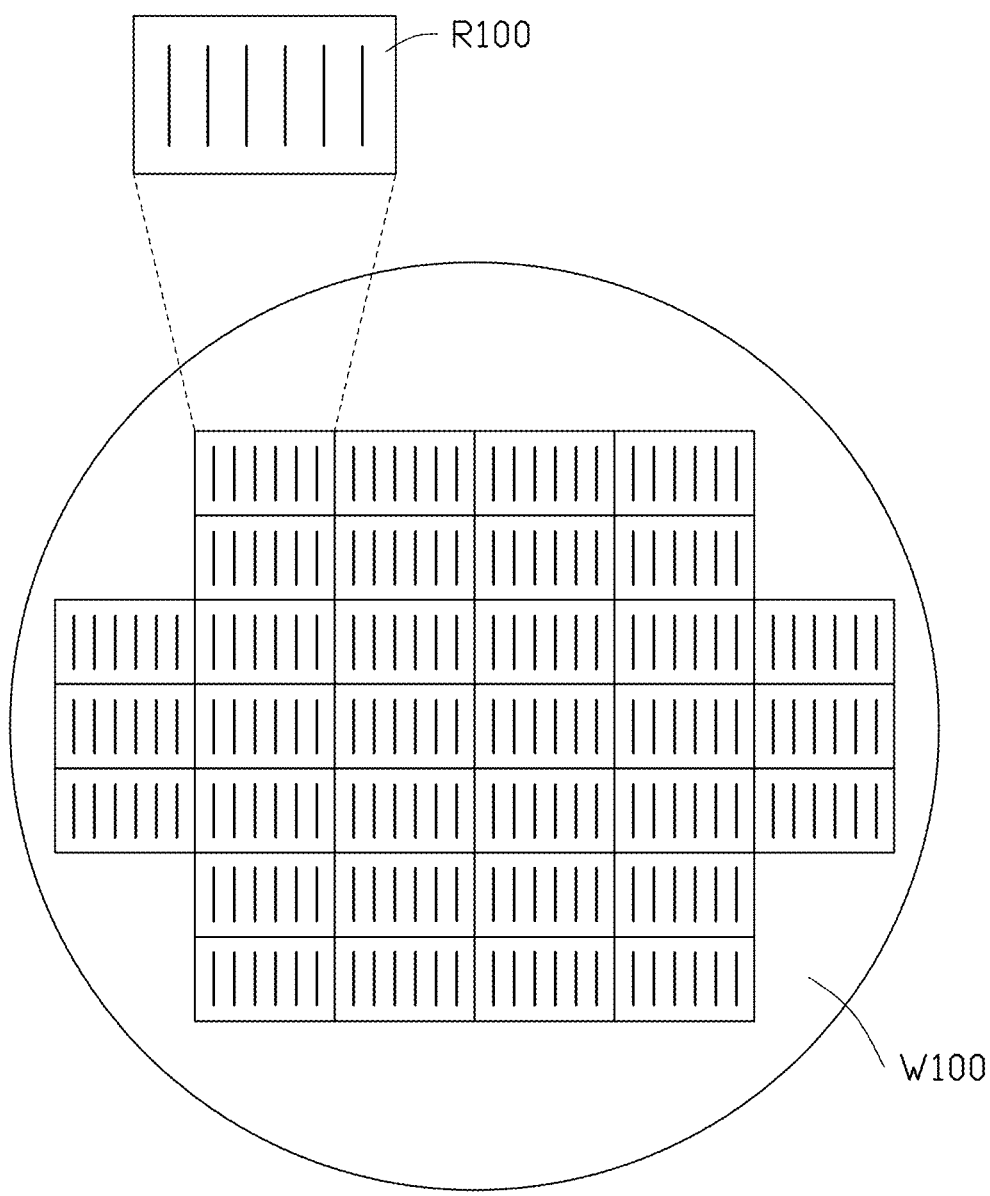
FIG. 1A is a schematic diagram showing an exposure process.
Figure 1B:
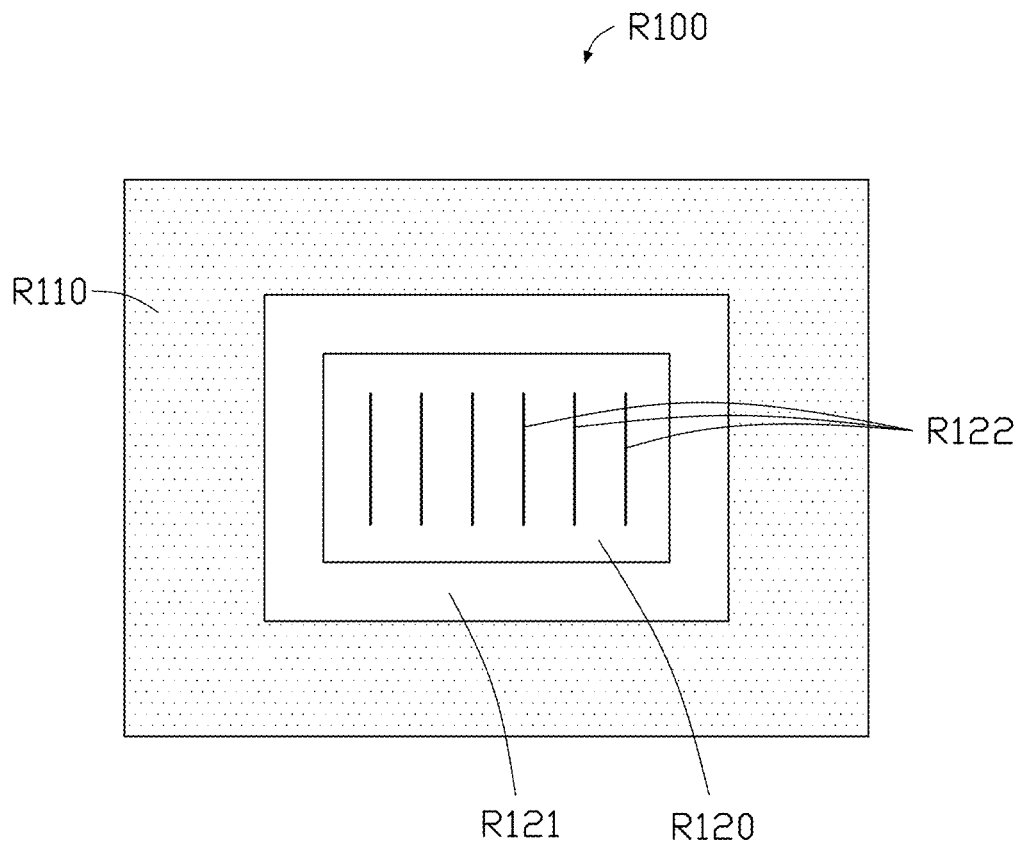
FIG. 1B is a schematic diagram of a reticle.
Figure 2A:
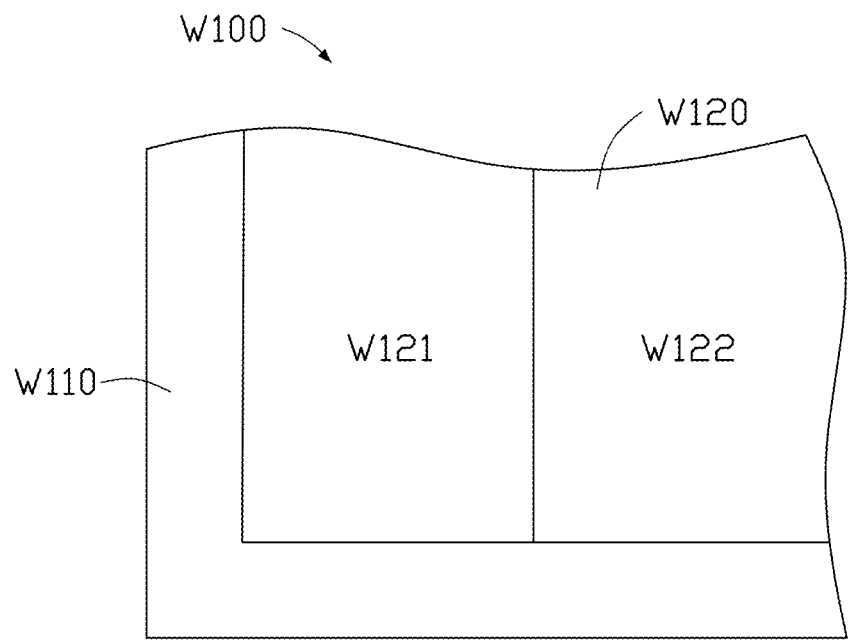
FIGS. 2A and 2B are a top view and a side view of a portion of a wafer before an exposure process.
Figure 2B:
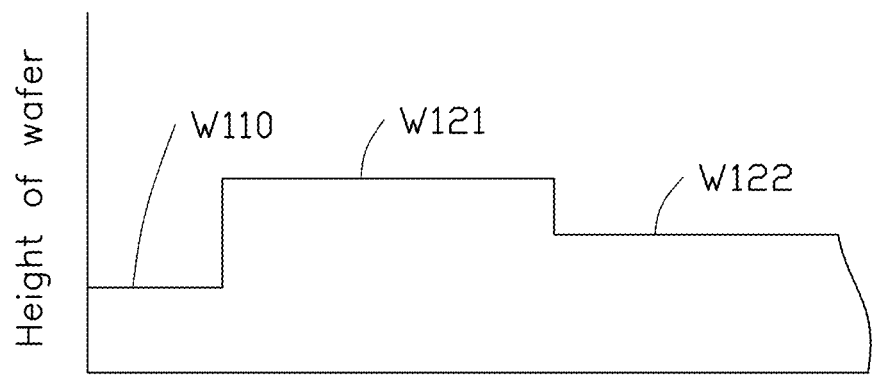

The present disclosure will now be described more fully hereinafter with reference to the accompanying drawings, in which example implementations of the disclosure are shown. This disclosure may, however, be implemented in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 3A to 8. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 3A:
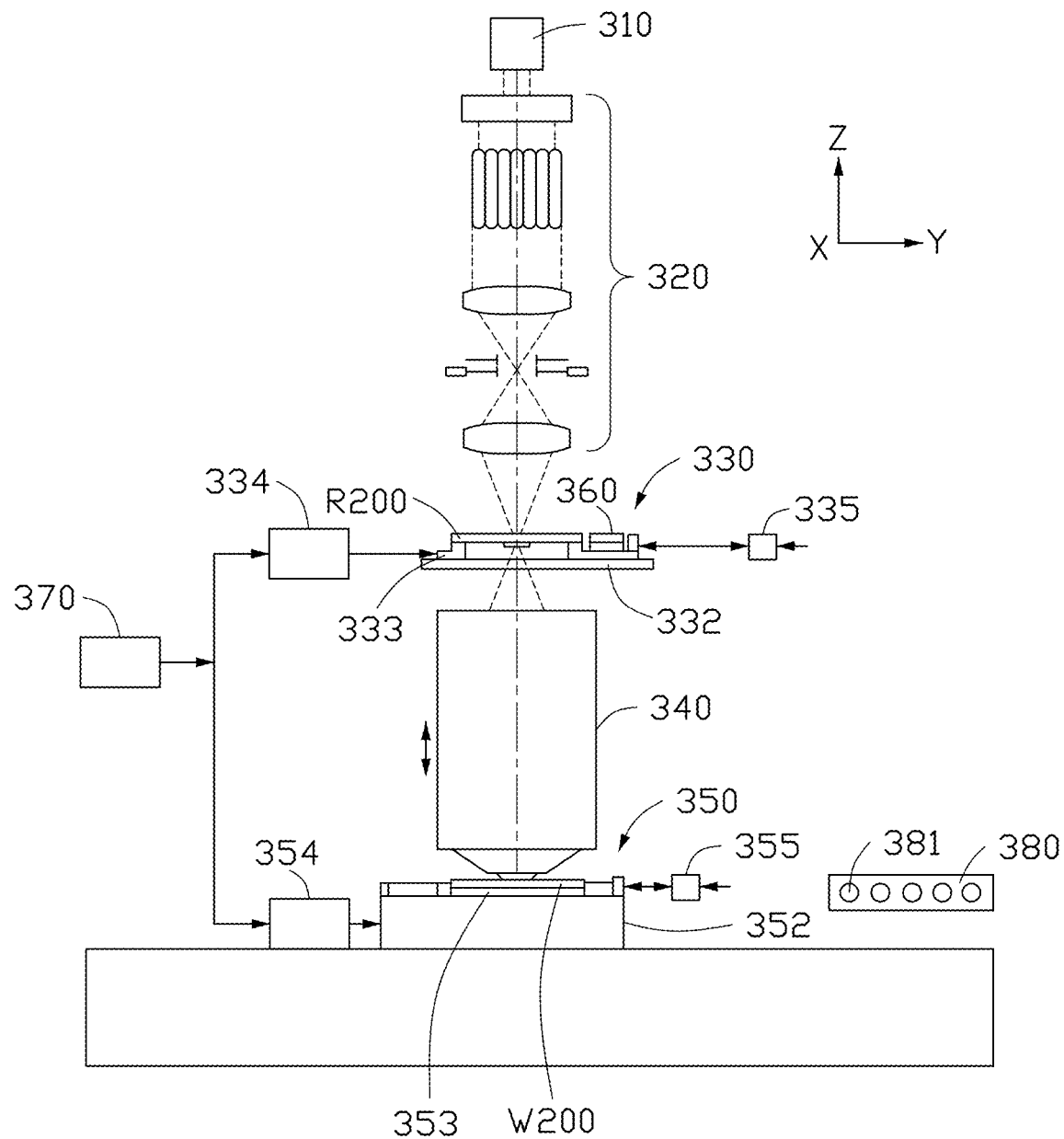
FIG. 3A is a schematic diagram of an exposure system according to a first implementation of the present disclosure.

Referring to FIG. 3A, a schematic diagram of an exposure system 300 according to a first implementation of the present disclosure is illustrated. The exposure system 300 is a lithography apparatus for an exposure process for transferring a pattern of a reticle R200 onto a wafer W200. The exposure system 300 includes a light source 310 configured to generate light, an illumination module 320 for illuminating the reticle R200 with the light from the light source 310, a reticle stage 330 configured to hold the reticle R200, and a projection module 340 configured to project the reticle R200 onto the wafer W200. The exposure system 300 also includes a wafer stage 350, a leveling module 380, and a control unit 370. The wafer stage 350 is configured to position the wafer W200.

The reticle stage 330 positions the reticle R200 by moving the reticle R200 in the Y-axis direction. In this implementation, the reticle stage 330 for holding the reticle R200 includes a reticle stage base 332, and a reticle holder 333 disposed on the reticle stage base 332 and for holding the reticle R200 over the reticle stage base 332. A first driving unit 334 drives the reticle stage base 332 according to a driving pattern. A first interferometer 335 continuously measures the position of the reticle stage base 332. The control unit 370 controls the first driving unit 334 to move the reticle stage base 332 according to the driving pattern at high accuracy.

The exposure system 300 may further include a determination unit 360 configured to determine a feature of the reticle R200 placed on the reticle stage base 332. The determination unit 360 is constructed by, for example, a reading unit that reads an identifier such as a barcode formed on the reticle R200. Also, the determination unit 360 may be constructed by an image sensing unit that senses the image of the reticle R200, such as an area sensor, reflective sensor, or camera, and an image processing unit that processes an image sensed by the image sensing unit. The feature of the reticle R200 includes, for example, at least one of the type of the reticle or the shape of the reticle. The type of the reticle may vary. Examples are a general reticle (e.g., a reticle on which a circuit pattern is drawn) used to fabricate a semiconductor device, and a special reticle used for a special purpose. The special reticle may include various jigs and is not limited to the reticle on which a circuit pattern is formed.

The projection module 340 projects the reticle R200 illuminated by the light from the illumination module 320 at a predetermined magnification, such as ¼ or ⅕, onto the wafer W200. The projection module 340 may employ a first optical module solely including a plurality of lens elements, a second optical module including a plurality of lens elements and at least one concave minor (e.g., a catadioptric optical system), a third optical module including a plurality of lens elements and at least one diffractive optical element such as a kinoform, and a full minor module. Any necessary correction of the chromatic aberration may be performed by using a plurality of lens elements made from soda-lime glass materials having different dispersion values (or Abbe values), or arrange a diffractive optical element to disperses the light in a direction opposite to that of the lens elements.

The wafer stage 350 positions the wafer W200 by moving the wafer W200 in the X-axis and Y-axis directions. In this implementation, the wafer stage 350 includes a wafer stage base 352 on which the wafer W200 is placed, a wafer holder 353 for holding the wafer W200 on the wafer stage base 352, and a second driving unit 354 for driving the wafer stage base 352. A second interferometer 355 continuously measures the position of the wafer stage base 352. The control unit 370 controls the position of the wafer stage base 352 through the second driving unit 354 at high accuracy.

The control unit 370 includes a central processing unit (CPU), a memory, and a user interface, and controls the overall operation of the exposure system 300. The control unit 370 controls an exposure process of transferring the pattern of the reticle R200 onto the wafer W200, as well as a leveling process of the wafer W200 before the exposure process. The leveling module 380 has a plurality of leveling sensors 381 and is configured to pre-scan the wafer W200 to obtain topography data of the wafer before the exposure process is performed.

Figure 3B:
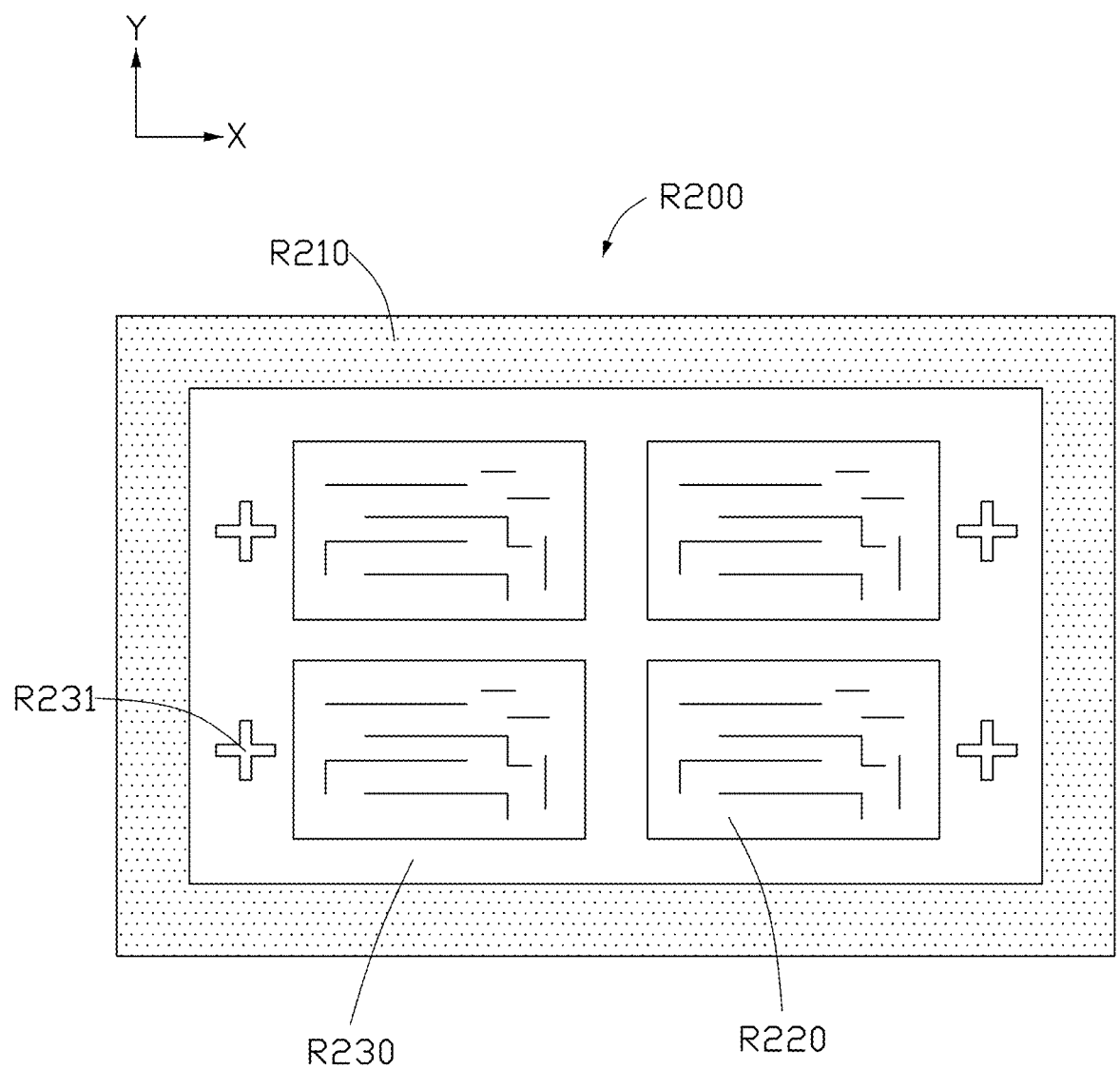
FIG. 3B is a schematic diagram of a reticle in FIG. 3A.

Referring to FIG. 3B, a schematic diagram of the reticle R200 is illustrated. As shown in FIG. 3B, the reticle R200 includes at least one die region R220, and at least one scribe line R230 at a periphery of the die region R220. An opaque region R210 is disposed at an outer frame of the reticle R200. The die region R220 includes transparent portions and opaque portions defining a device pattern. For the sake of simplicity, the device pattern is not illustrated in detail in the figure. The transparent portions in the die region R220 allow the light from the light source 310 to penetrate through them and reach the wafer W200. On the other hand, the opaque portions of the die region R220 block the light from the light source 310. The scribe line R230 contains information regarding the exposure process of the wafer and usually includes test structures to facilitate verification of the performance of the exposure process. For example, the scribe line R230 may include at least one alignment mark R231 to allow verification of the accuracy of reticle alignment during the exposure process.

Figure 3C:
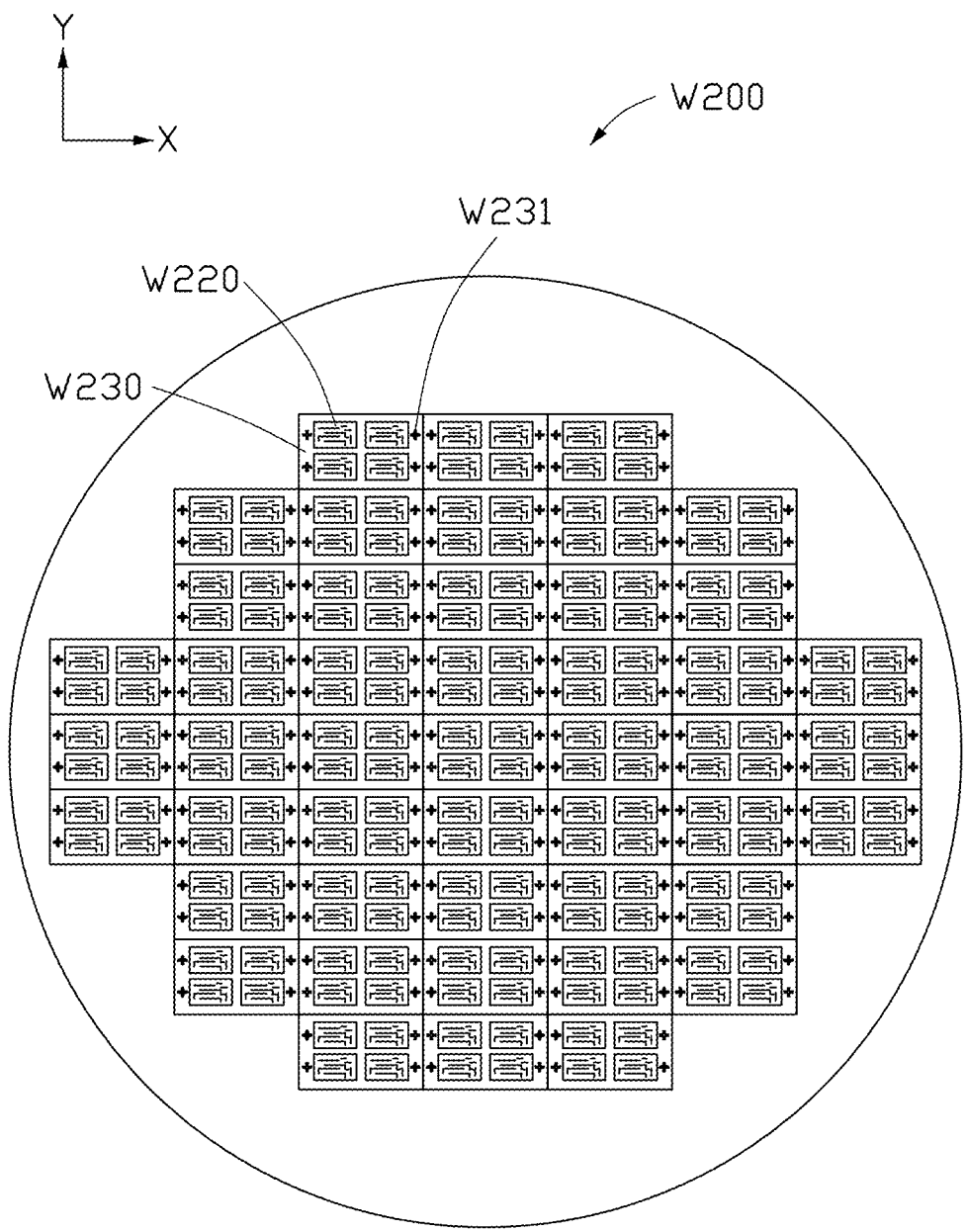
FIG. 3C is a top view of a wafer of FIG. 3A.
Figure 3D:
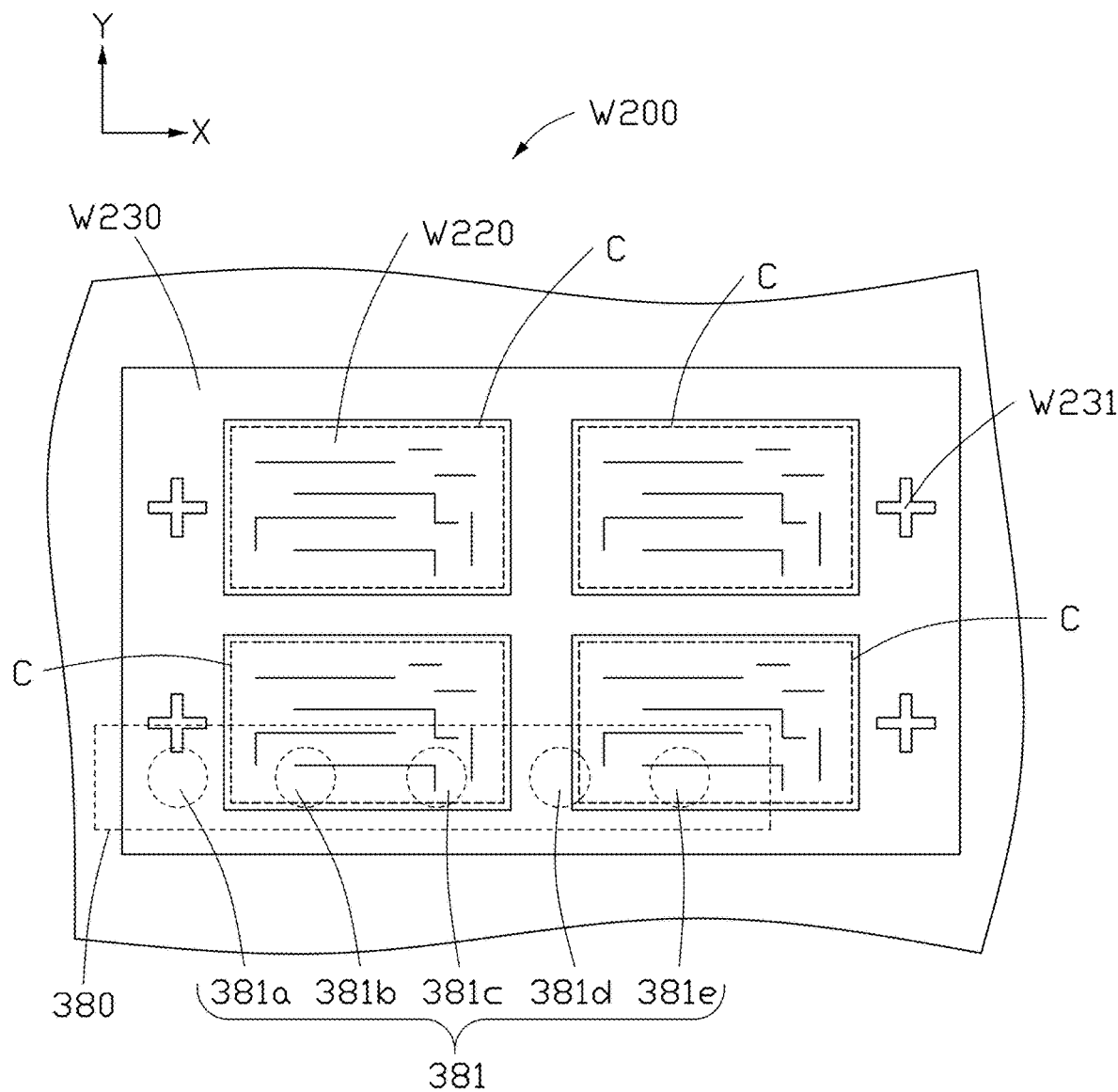
FIG. 3D is a schematic diagram showing a leveling process for a portion of the wafer of FIG. 3C.

Referring to FIGS. 3C and 3D, a top view of the wafer W200 and a schematic diagram showing a leveling process for a portion of the wafer W200 are illustrated. The wafer W200 includes a plurality of regions. The regions on the wafer W200 may include at least one die region W220 and at least one scribe line W230. The scribe line W230 of the wafer may include at least one alignment mark W231. The regions on the wafer W200 may have different topography data (i.e., heights or surface elevation). Before the exposure process of transferring the pattern of the reticle R200 onto the wafer W200 is performed, the wafer W200 must be pre-scanned by the leveling module 380 of the exposure system 300 to obtain the topography data (i.e., a height for each of the regions on the wafer W200) of the wafer W200. The control unit 370 may control an exposure energy of the light source 310 and a depth of focus of the projection module 340 according to the topography data of the wafer W200 during the exposure process. As shown in FIG. 3D, when a portion of the wafer W200 is being pre-scanned, the leveling sensors (e.g., leveling sensors 381a to 381e) of the leveling module 380 are disposed above the portion of the wafer W200. By detecting light reflected from a surface of the wafer W200 by using the leveling sensors of the leveling module 380, the topography data of the wafer W200 (i.e., the height for each of the regions on the wafer W200) is obtained. After the topography data of the wafer W200 is obtained, the control unit 370 assigns critical regions and non-critical regions to the plurality of regions on the wafer W200 according to layout information of the reticle R200. Usually, the exposure process must be operated at high accuracy to ensure the quality of the semiconductor device. To facilitate such high accuracy, the control unit 370 of the exposure system 300 controls the exposure energy of the light source 310 and the depth of focus of the projection module 340 according to the topography data of the wafer W200. The non-critical regions on the wafer W200 are the regions that do not affect the quality of the semiconductor device during the exposure process. The critical regions on the wafer W200 are the regions that affect the quality of the semiconductor device during the exposure process.

The layout information of the reticle R200 includes coordinates and a size of each of the scribe line R230 and the die region R220. In one implementation, the non-critical regions on the wafer W200 are assigned according to the coordinates and the size of each of the scribe line R230 and a portion of the die region R220 of the reticle R200. The critical regions on the wafer W200 are assigned according to the coordinates and the size of another portion of the die region R220 of the reticle R200. For example, for manufacturing a dynamic random access memory (DRAM) device, the die region R220 of the reticle R200 may include a cell portion (including a plurality of capacitors and transistors) and a peri portion. The non-critical regions on the wafer W200 may be assigned according to the coordinates and the size of each of the scribe line R230 and the peri portion of the die region R220 of the reticle R200. The critical regions on the wafer W200 may be assigned according to the coordinates and the size of the cell portion of the die region R220 of the reticle R200.

In some implementations, the non-critical regions on the wafer W200 are assigned according to the coordinates and the size of the scribe line R230 of the reticle R200. The critical regions on the wafer W200 are assigned according to the coordinates and the size of the die region R220 of the reticle R200.

After the non-critical regions and the critical regions on the wafer W200 are assigned, the control unit 370 modifies the topography data of the wafer W200 by removing a portion of the topography data corresponding to the non-critical regions on the wafer W200. Then, the control unit 370 controls the exposure process according to the modified topography data of the wafer W200. During the exposure process, when exposing the non-critical regions on the wafer W200, the control unit 370 stops adjusting the exposure energy of the light source 310 or the depth of focus of the projection module 340. In contrast, when exposing the critical regions on the wafer W200, the control unit 370 controls the exposure energy of the light source 310 and the depth of focus of the projection module 340 according to the topography data of the critical region on the wafer W200. Therefore, by removing the topography data of the non-critical regions on the wafer, the loading of the exposure system 300 can be reduced. Also, the exposure system 300 has a certain operation window (i.e., ranges of exposure energy and depth of focus). By removing the topography data of non-critical regions, usually have higher topography variation than those of the critical regions, the exposure system 300 can be operated at a wider operation window as compared to using full topography data of the wafer W200.

Figure 4:
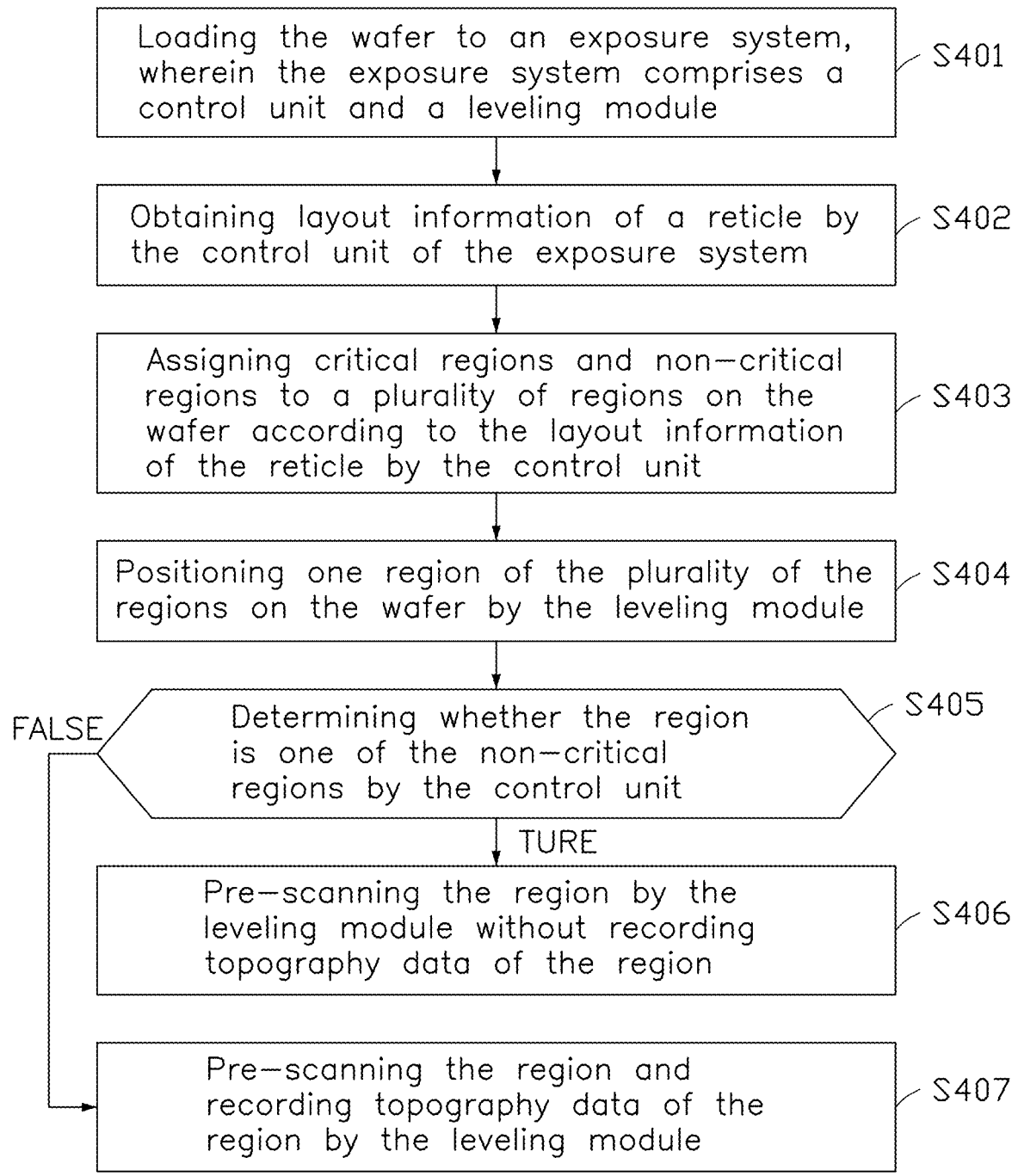
FIG. 4 is a flowchart of a method of leveling a wafer according to a second implementation of the present disclosure.

Referring to FIG. 4, a flowchart of a method of leveling a wafer in an exposure process according to a second implementation of the present disclosure is illustrated. As shown in FIG. 4, the method includes actions S401 to S407.

In action S401, the wafer is loaded to an exposure system having a control unit and a leveling module. The exposure system and the wafer can be referred to the exposure system 300 and the wafer W200 of FIGS. 3A to 3D. The exposure system 300 is a lithography apparatus for performing the exposure process of transferring a pattern of a reticle R200 onto the wafer W200. The exposure system 300 includes a light source 310 configured to generate light, an illumination module 320 for illuminating a reticle R200 with the light from the light source 310, a reticle stage 330 configured to hold the reticle R200, and a projection module 340 configured to project the reticle R200 onto the wafer W200. The exposure system 300 also includes a wafer stage 350 configured to position the wafer W200, a leveling module 380, and a control unit 370.

In action S402, the control unit 370 of the exposure system 300 obtains layout information of the reticle R200. As shown in FIG. 3B, the reticle R200 includes at least one die region R220, and at least one scribe line R230 at a periphery of the die region R220. An opaque region R210 is disposed at an outer frame of the reticle R200. The die region R220 includes transparent portions and opaque portions defining a device pattern. The transparent portions in the die region R220 allow the light from the light source 310 to penetrate through them and reach the wafer W200. On the other hand, the opaque portions of the die region R220 block the light from the light source 310. The scribe line R230 contains information regarding the exposure process of the wafer and usually includes test structures to facilitate verification of the performance of the exposure process. For example, the scribe line R230 may include at least one alignment mark R231 to allow verification of the accuracy of reticle alignment during the exposure process. The layout information of the reticle R200 includes a coordinate and a size of each of the scribe line R230 and the die region R220.

In action S403, the control unit 370 of the exposure system 300 assigns critical regions and non-critical regions to the plurality of regions on the wafer W200 according to the layout information of the reticle R200.

In one implementation, the non-critical regions on the wafer W200 are assigned according to the coordinates and the size of each of the scribe line R230 and a portion of the die region R220 of the reticle R200. The critical regions on the wafer W200 are assigned according to the coordinates and the size of another portion of the die region R220 of the reticle R200. For example, for manufacturing a DRAM device, the die region R220 of the reticle R200 may include a cell portion (including a plurality of capacitors and transistors) and a peri portion. The non-critical regions on the wafer W200 may be assigned according to the coordinates and the size of each of the scribe line R230 and the peri portion of the die region R220 of the reticle R200. The critical regions on the wafer W200 may be assigned according to the coordinates and the size of the cell portion of the die region R220 of the reticle R200.

In some implementations, the non-critical regions on the wafer W200 are assigned according to the coordinates and the size of the scribe line R230 of the reticle R200. The critical regions on the wafer W200 are assigned according to the coordinates and the size of the die region R220 of the reticle R200.

In action S404, one region of the plurality of regions on the wafer W200 is positioned by the leveling module 380 of the exposure system 300. In action S405, the control unit 370 of the exposure system 300 determines whether the region is one of the non-critical regions. In action S406 or S407, the leveling module 380 of the exposure system 300 pre-scans the region according to a result of the determination of action S405. In action S406, if the determination in action S405 is true (i.e., the region is determined to be one of the non-critical regions), the action of pre-scanning the region is performed without recording topography data of the region. In action S407, if the determination in action S405 is false (i.e., the region is determined to be one of the critical regions), topography data of the region is recorded when the action of pre-scanning the region is performed. As shown in FIGS. 3A and 3D, the leveling module 380 includes a plurality of leveling sensors 381 configured to pre-scan the wafer. When the action of pre-scanning the non-critical regions on the wafer W200 is performed (action S406), a portion of the leveling sensors 381 being disposed above the non-critical regions on the wafer W200 are turned off. When the action of pre-scanning the critical regions on the wafer W200 is performed (action S407), a portion of the leveling sensors 381 being disposed above the critical regions on the wafer W200 are turned on. For example, as shown in FIG. 3D, the critical regions on the wafer W200 are indicated as regions C, and the non-critical regions on the wafer W200 are the regions on the wafer W200 that are outside the regions C. The leveling sensors 381$a$ and 381$d$ are disposed above the non-critical regions on the wafer W200, and the leveling sensors 381$b$, 381$c$, and 381$e$ are disposed above the critical regions (e.g., regions C) of the wafer W200. The leveling sensors 381$a$ and 381$d$ are turned off when pre-scanning the non-critical regions on the wafer W200. The leveling sensor 381$b$, 381$c$, and 381$e$ are turned on when pre-scanning the critical regions (e.g., regions C) on the wafer W200. Accordingly, the leveling sensors 381 of the leveling module 380 only pre-scan the critical regions on the wafer W200. Therefore, the loading of the exposure system 300 can be reduced. Also, the exposure system 300 has a certain operation window for the exposure process after the pre-scanning process. The operation window of the exposure system 300 may be the ranges of exposure energy of the light source 310 and depth of focus of the projection module 340. The exposure energy of the light source 310 and the depth of focus of the projection module 340 may be adjusted according to the topography data of the wafer W200 in the exposure process. By skipping the pre-scanning of the non-critical regions on the wafer W200 that usually have higher topography variation than those of the critical regions, the exposure system 300 can be operated at a wider operation window for the exposure process as compared to fully pre-scanning the wafer W200.

Figure 5:
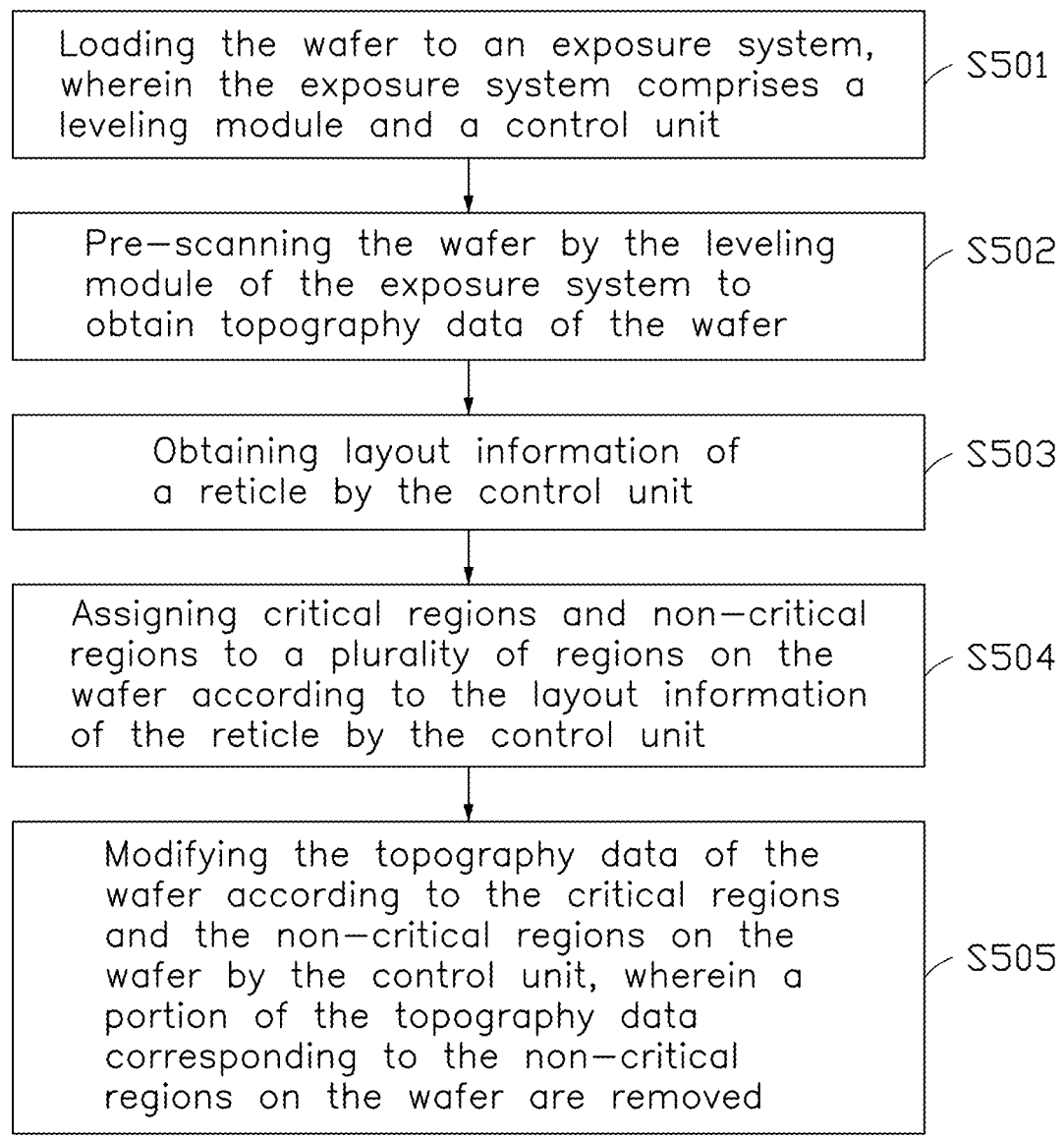
FIG. 5 is a flowchart of a method of leveling a wafer according to a third implementation of the present disclosure.

Referring to FIG. 5, a flowchart of a method S500 of leveling a wafer in an exposure process according to a third implementation of the present disclosure is illustrated. As shown in FIG. 5, the method S500 includes actions S501 to S505.

In action S501, the wafer is loaded to an exposure system having a control unit and a leveling module. The exposure system, and the wafer can be referred to the exposure system 300 and the wafer W200 of FIGS. 3A to 3D. The exposure system 300 is a lithography apparatus for performing the exposure process of transferring a pattern of a reticle R200 onto the wafer W200. The exposure system 300 includes a light source 310 configured to generate light, an illumination module 320 for illuminating a reticle R200 with the light from the light source 310, a reticle stage 330 configured to hold the reticle R200, and a projection module 340 configured to project the pattern of the reticle R200 onto the wafer W200. The exposure system 300 also includes a wafer stage 350 configured to position the wafer W200, the leveling module 380, and the control unit 370. The wafer W200 has a plurality of regions as shown in FIG. 3C. The leveling module 380 includes a plurality of leveling sensors 381 configured to pre-scan the wafer W200.

In action S502, the wafer W200 is pre-scanned by the leveling module 380 of the exposure system 300 to obtain topography data of the wafer W200. As shown in FIG. 3D, the leveling sensors 381 of the leveling module 380 are disposed above the wafer W200. The leveling module 380 moves in the x-direction and y-direction to pre-scan the whole wafer W200. By detecting light reflected from the surface of the wafer W200, the topography data (i.e., heights) of the wafer W200 can be obtained.

In action S503, the control unit 370 of the exposure system 300 obtains layout information of the reticle R200. As shown in FIG. 3B, the reticle R200 includes at least one die region R220, and at least one scribe line R230 at a periphery of the die region R220. An opaque region R210 is disposed at an outer frame of the reticle R200. The die region R220 includes transparent portions and opaque portions defining a device pattern. The transparent portions in the die region R220 allow the light from the light source 310 to penetrate through them and reach the wafer W200. On the other hand, the opaque portions of the die region R220 block the light from the light source 310. The scribe line R230 contains information regarding the exposure process of the wafer and usually includes test structures to facilitate verification of the performance of the exposure process. For example, the scribe line R230 may include at least one alignment mark R231 to allow verification of the accuracy of reticle alignment during the exposure process. The layout information of the reticle R200 includes a coordinate and a size of the scribe line R230 and the die region R220.

In action S504, the control unit 370 of the exposure system 300 assigns critical regions and non-critical regions to the plurality of regions on the wafer W200 according to the layout information of the reticle R200. For example, as shown in FIG. 3D, the critical regions on the wafer W200 are annotated as regions C, and the non-critical regions on the wafer W200 are the regions on the wafer W200 that are outside the regions C.

In one implementation, the non-critical regions on the wafer W200 are assigned according to the coordinates and the size of each of the scribe line R230 and a portion of the die region R220 of the reticle R200. The critical regions on the wafer W200 are assigned according to the coordinates and the size of other portions of the die region R220 of the reticle R200. For example, for manufacturing a DRAM device, the die region R220 of the reticle R200 may include a cell portion (including a plurality of capacitors and transistors) and a peri portion. The non-critical regions on the wafer W200 may be assigned according to the coordinates and the size of each of the scribe line R230 and the peri portion of the die region R220 of the reticle R200. The critical regions on the wafer W200 may be assigned according to the coordinates and the size of the cell portion of the die region R220 of the reticle R200.

In some implementations, the non-critical regions on the wafer W200 are assigned according to the coordinates and the size of the scribe line R230 of the reticle R200. The critical regions on the wafer W200 are assigned according to the coordinates and the size of the die region R220 of the reticle R200.

Figure 6A:
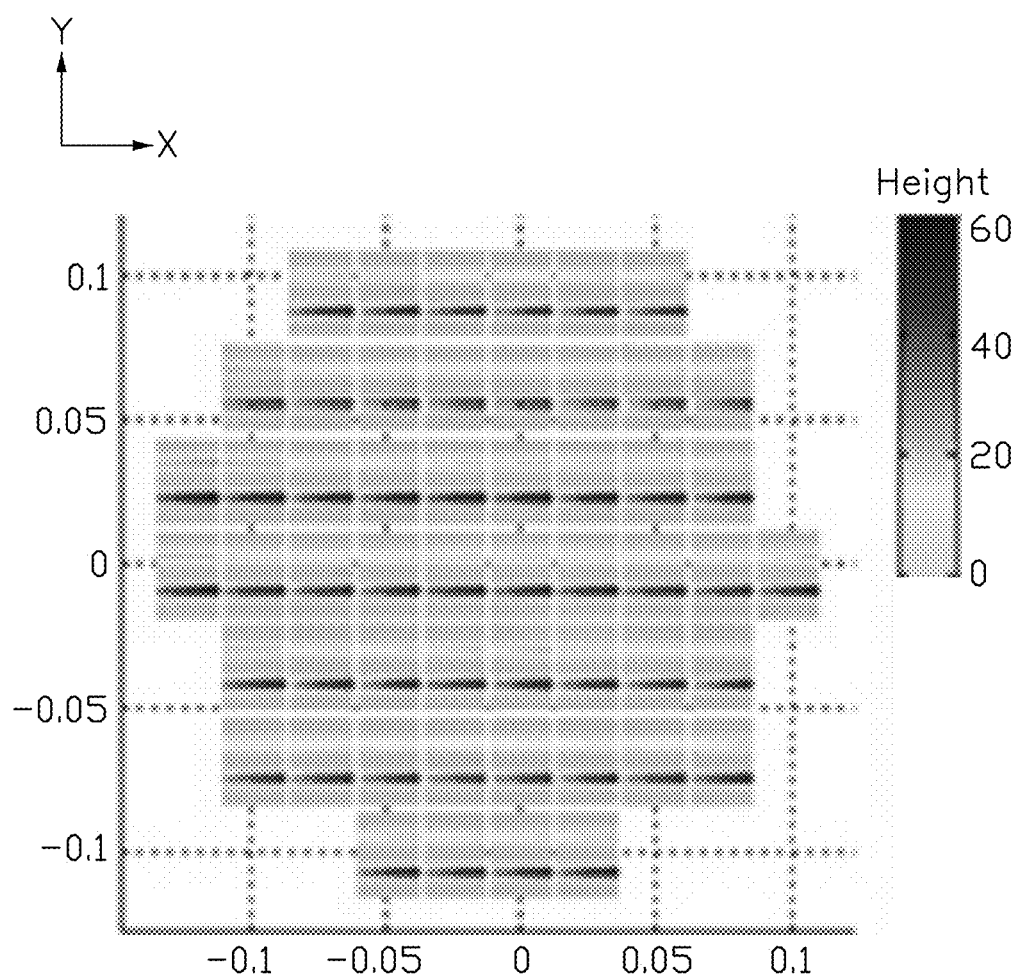
FIGS. 6A and 6B are diagrams showing topography data of the wafer according to the third implementation of the present disclosure.
Figure 6B:
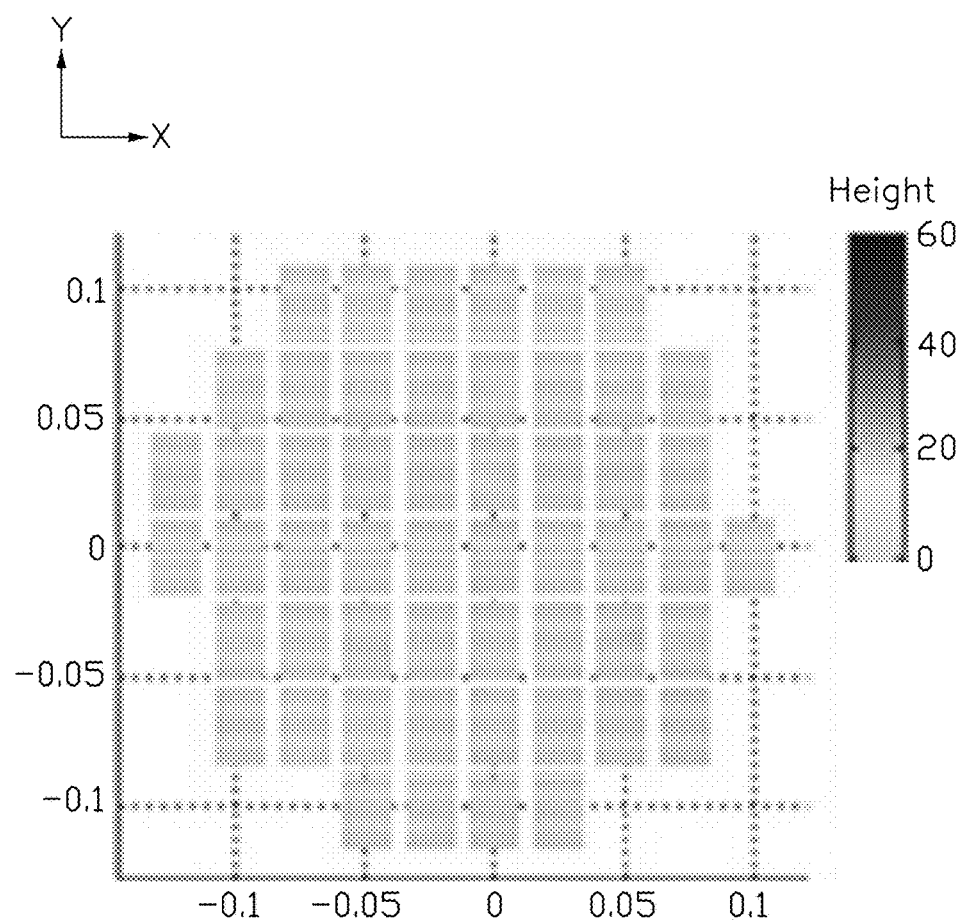

In action S505, the topography data of the wafer W200 is modified according to the critical regions and the non-critical regions on the wafer. The topography data of the wafer is modified by removing a portion of the topography data corresponding to the non-critical regions on the wafer W200. Referring to FIGS. 6A and 6B, FIG. 6A is a diagram showing the topography data of the wafer W200 before modification, and FIG. 6B is a diagram showing the topography data of the wafer W200 after modification. As shown in FIG. 6A, the original topography data of the wafer W200 has a wide variation. After removing the topography data of the non-critical region on the wafer W200, as shown in FIG. 6B, the variation of the topography data of the wafer W200 is reduced. By using the modified topography data to perform the subsequent exposure process, the loading of the exposure system 300 can be reduced.

Figure 7:
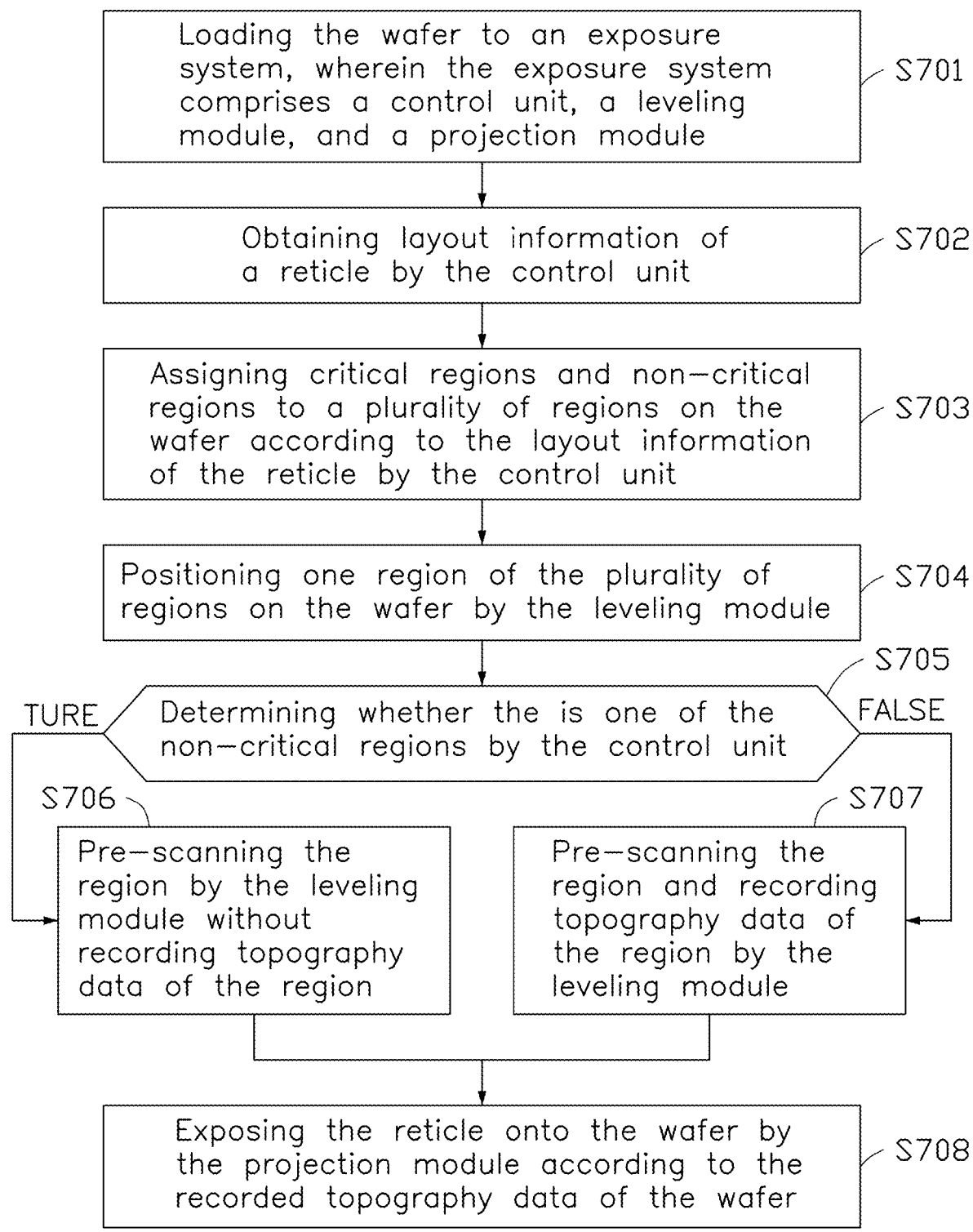
FIG. 7 is a flowchart of a method of pattern transferring in an exposure process according to a fourth implementation of the present disclosure.

Referring to FIG. 7, a flowchart of a method S700 of pattern transferring in an exposure process according to a fourth implementation of the present disclosure is illustrated. As shown in FIG. 7, the method S700 includes actions S701 to S708. The actions S701 to S707 of the method S700 of this implementation are similar to the actions S401 to S407 of the method S400 of the second implementation without further description herein. In action S708, the reticle is exposed onto the wafer according to the recorded topography data of the wafer.

Figure 8:
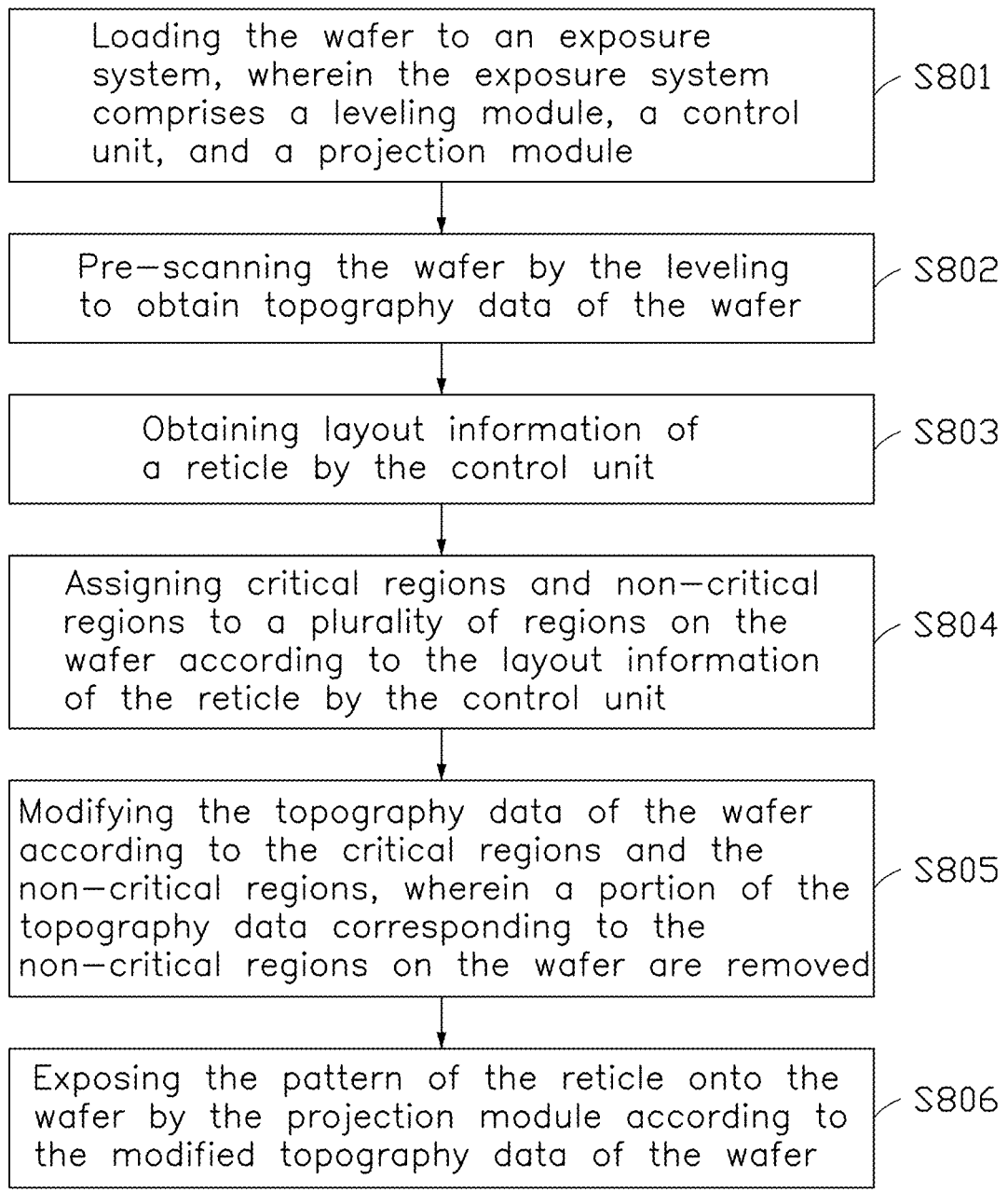
FIG. 8 is a flowchart of a method of pattern transferring in an exposure process according to a fifth implementation of the present disclosure.

Referring to FIG. 8, a flowchart of a method S800 of pattern transferring in an exposure process according to a fifth implementation of the present disclosure is illustrated. As shown in FIG. 8, the method S800 includes actions S801 to S806. The actions S801 to S805 of the method S800 of this implementation are similar to the actions S501 to S505 of the method S500 of the third implementation without further description herein. In action S806, the reticle is exposed onto the wafer according to the modified topography data of the wafer.

According to a sixth implementation, the present disclosure also is directed to an exposure system for an exposure process. The exposure system and the wafer can be referred to the exposure system 300 and the wafer W200 of FIGS. 3A to 3D. The wafer W200 includes a plurality of regions. The exposure system 300 includes a light source 310, an illumination module 320, a reticle stage 330, a projection module 340, a wafer stage 350, a leveling module 380, and a control unit 370. The light source 310 is configured to generate light. The illumination module 320 is configured to illuminate a reticle R200 with the light from the light source 310. The reticle stage 330 is configured to hold the reticle R200. The projection module 340 is configured to project the reticle R200 onto the wafer W200. The wafer stage 350 is configured to position the wafer W200. The leveling module 380 has a plurality of leveling sensors 381 and is configured to pre-scan the wafer W200 before the exposure process is performed. The control unit 370 is configured to control the exposure process. The control unit 370 assigns critical regions and non-critical regions to a plurality of regions on the wafer W200 according to layout information of the reticle R200. When pre-scanning the wafer W200, the leveling module 380 pre-scans the non-critical regions on the wafer W200 without recording topography data of the non-critical regions, and pre-scans the critical regions on the wafer to record topography data of the critical regions. When pre-scanning the non-critical regions on the wafer W200, the leveling sensors 381 above the non-critical regions are turned off. When pre-scanning the non-critical regions on the wafer W200, the leveling sensors 381 above the critical regions are turned on. The control unit 370 controls the exposure process according to the recorded topography data of the wafer W200.

As described above, the method of leveling a wafer and the exposure system of the implementations of the present disclosure assign non-critical regions and critical regions to the wafer according to layout information of the reticle. By removing the topography data of the non-critical regions on the wafer, the loading of the exposure system during the exposure process can be reduced. Therefore, the method of leveling a wafer and the exposure system of the implementations of the present disclosure can improve wafer leveling for the exposure process of the wafer.

The implementations shown and described above are only examples. Many details are often found in the art such as the other features of a method of leveling a wafer and an exposure system. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A method of leveling a wafer in an exposure process, the method comprising:
   loading the wafer to an exposure system, wherein the exposure system comprises a control unit and a leveling module;
   obtaining layout information of a reticle by the control unit, wherein the reticle comprises at least one scribe line and at least one die region, the layout information of the reticle comprises a coordinate and a size of each of the scribe line and the die region;
   assigning critical regions and non-critical regions to a plurality of regions on the wafer according to the layout information of the reticle by the control unit, wherein the non-critical regions on the wafer are assigned according to the coordinate and the size of each of the scribe line and a portion the die region, and the critical regions on the wafer are assigned according to the coordinate and the size of another portion of the die region;
   positioning one region of the plurality of regions on the wafer by the leveling module;
   determining whether the region is one of the non-critical regions by the control unit; and
   pre-scanning the region by the leveling module of the exposure system according to a determining result.

2. The method of claim 1, wherein if the determining result is true, the pre-scanning the region is performed without recording topography data of the region.

3. The method of claim 2, wherein if the determining result is false, topography data of the region is recorded when the pre-scanning the region is performed.

4. The method of claim 1, wherein the leveling module comprises a plurality of leveling sensors configured to pre-scan the wafer, and when the pre-scanning the non-critical regions on the wafer is performed, a portion of the leveling sensors being disposed above the non-critical regions are turned off.

5. The method of claim 1, wherein the leveling module comprises a plurality of leveling sensors configured to pre-scan the wafer, and when the pre-scanning the critical regions on the wafer is performed, a portion of the leveling sensors being disposed above the critical regions are turned on.

6. A method of leveling a wafer in an exposure process, the method comprising:
   loading the wafer to an exposure system, wherein the exposure system comprises a leveling module and a control unit;
   pre-scanning the wafer by the leveling module to obtain topography data of the wafer;
   obtaining layout information of a reticle by the control unit, wherein the reticle comprises at least one scribe line and at least one die region, the layout information of the reticle comprises a coordinate and a size of each of the scribe line and the die region;
   assigning critical regions and non-critical regions to a plurality of regions on the wafer according to the layout information of the reticle by the control unit, wherein the non-critical regions on the wafer are assigned according to the coordinate and the size of each of the scribe line and a portion the die region, and the critical regions on the wafer are assigned according to the coordinate and the size of another portion of the die region; and
   modifying the topography data of the wafer according to the critical regions and the non-critical regions on the wafer by the control unit.

7. The method of claim 6, wherein the modifying the topography data of the wafer is performed by removing a portion of the topography data corresponding to the non-critical regions on the wafer.

8. A method of pattern transferring in an exposure process, the method comprising:
   loading a wafer to an exposure system, wherein the exposure system comprises a control unit, a leveling module, and a projection module;
   obtaining layout information of a reticle by the control unit of the exposure system, wherein the reticle comprises at least one scribe line and at least one die region, the layout information of the reticle comprises a coordinate and a size of each of the scribe line and the die region;
   assigning critical regions and non-critical regions to a plurality of regions on the wafer according to the layout information of the reticle by the control unit, wherein the non-critical regions on the wafer are assigned according to the coordinate and the size of each of the scribe line and a portion the die region, and the critical regions on the wafer are assigned according to the coordinate and the size of another portion of the die region;
   positioning one region of the plurality of regions on the wafer by the leveling module;
   determining whether the region is one of the non-critical regions by the control unit;
   pre-scanning the region by the leveling module of the exposure system without recording topography data of the region if the region is determined to be one of the non-critical regions, or pre-scanning the region and recording the topography data of the region by the leveling module if the region is not determined to be one of the critical regions; and
   exposing the reticle to the wafer by the projection module according to the recorded topography data of the wafer.

* * * * *